United States Patent [19]

Hirukawa et al.

[11] Patent Number: 5,475,490

[45] Date of Patent: Dec. 12, 1995

[54] METHOD OF MEASURING A LEVELING PLANE

[75] Inventors: Shigeru Hirukawa, Kashiwa; Eiji Takane, Tokyo, both of Japan

[73] Assignee: Nikon Corporation, Tokyo, Japan

[21] Appl. No.: 181,463

[22] Filed: Jan. 14, 1994

[30] Foreign Application Priority Data

Jan. 14, 1993 [JP] Japan .................. 5-004866

[51] Int. Cl.⁶ ................................. G01B 11/00
[52] U.S. Cl. ................ 356/375; 250/548; 355/77; 355/53
[58] Field of Search .................. 356/150, 375, 356/400, 401; 250/561, 548; 355/53, 77

[56] References Cited

U.S. PATENT DOCUMENTS

| | | | |
|---|---|---|---|
| 4,558,949 | 12/1985 | Uehara et al. | 356/152 |
| 4,677,301 | 6/1987 | Tanimoto et al. | 250/548 |
| 4,908,656 | 3/1990 | Suwa et al. | 355/53 |
| 4,999,669 | 3/1991 | Sakamoto et al. | 353/53 |
| 5,101,226 | 3/1992 | Beaulieu et al. | 353/53 |
| 5,218,415 | 6/1993 | Kawashima | 356/375 |
| 5,323,016 | 6/1994 | Yamada et al. | 356/401 |

FOREIGN PATENT DOCUMENTS 1-187817  7/1989  Japan .

*Primary Examiner*—F. L. Evans
*Attorney, Agent, or Firm*—Shapiro and Shapiro

[57] ABSTRACT

In order to measure inclination of a leveling plane with respect to the best image forming plane rapidly at a high accuracy without using a special super-flat wafer, the images of five focus measuring marks are exposed on shot areas partially overlapping with each other, on one hand, in a first exposure area when a focal position is made to coincide with a first focal position by operating a leveling mechanism and, on the other hand, in each of exposure areas when the focal positions are changed gradually. The best focal position is obtained by using an average of the mark lengths of the images of the marks as the mark lengths of the images of marks of measuring points at the upper left corners of the focal positions.

10 Claims, 6 Drawing Sheets

BLIND ID 1 3 · 2 4
1 3 · 2 4
1 3 · 2 4
1 3 · 2 4
1 3 · 2 4
1 3 · 2 4
1 3 · 2 4
1 3 · 2 4
1 3 · 2 4
1 3 · 2 4
1 3 · 2 4

FIG. 6C

ARRAY OF OFFSET ID

A C · B D
A C · B D
A C · B D
A C · B D
A C · B D
A C · B D
A C · B D
A C · B D
A C · B D
A C · B D
A C · B D

METHOD OF MEASURING A LEVELING PLANE

BACKGROUND OF THE INVENTION

1. Field of the Invention

The present invention relates to a method of measuring a leveling plane suited for checking the current state of a leveling plane which is used in an auto-leveling mechanism provided in a projection exposure apparatus which is employed for manufacturing semiconductor elements, liquid crystal display elements, thin film magnetic heads or the like in a lithographic process.

2. Related Background Art

For manufacture of semiconductor elements, liquid crystal display elements, thin film magnetic heads or the like in a lithographic process, a projection exposure apparatus is used which exposes pattern images of photomasks or reticles (hereinafter referred to only as "reticles") on photosensitive substrates through a projection optical system. In order to expose the pattern image of a reticle at high resolution on a photosensitive substrate in such a projection exposure apparatus, it is necessary to perform exposure by matching the exposure surface of the photosensitive substrate with the best image forming plane of the projection optical system within the range of the focal depth. As disclosed in U.S. Pat. No. 4,558,949 for example, a conventional projection exposure apparatus for performing this exposure comprises an auto-leveling mechanism for keeping the exposure face of a photosensitive substrate in parallel with the best image forming plane of the projection optical system, and an auto-focussing mechanism for keeping the position of the exposure face of the photosensitive substrate along the optical axis (i.e., the focal position) at the best focal position which is the best image forming position of the exposure face. In the following description, semiconductor wafers coated with photoresists or the like will be used as photosensitive substrates.

With the conventional leveling mechanism, the surface of a wafer mounted on a leveling stage by a wafer holder is selected as a leveling plane, and the amount of inclination of the leveling plane with respect to the best image forming plane of the projection optical system is obtained as will be described later. The leveling plane is held in an inclined state by the amount of inclination. A leveling sensor is provided which detects the average value of Inclination of a surface in a predetermined test area in the exposure field of the projection optical system. An output signal which is to be supplied by the leveling sensor indicating the state in which the surface of a wafer in the test area is in parallel with the best image forming plane is previously obtained. Thereafter, the inclination of the wafer is automatically controlled by a leveling stage so that the leveling sensor outputs the signal. In other words, auto-leveling is performed.

Conventionally, the amounts of inclination of the leveling plane and the best image forming plane are obtained from a "stage running plane" of an XY stage, as a datum (reference) plane, for positioning a wafer in a plane substantially perpendicular to the optical axis of the projection optical system (the plane being called an XY plane). The stage running plane is defined by a plane formed by a locus of an arbitrary point on the surface of a wafer mounted on the XY stage by a leveling stage and a wafer holder and the like, when the XY stage moves in the XY plane.

The amounts of inclination of the best image forming plane and the leveling plane are measured on the basis of the stage running plane, respectively. The difference between them is obtained as an inclination error of the leveling plane with respect to the best image forming plane. The projection exposure apparatus is provided with a Z stage for positioning the wafer along the optical axis (in the Z direction), and the auto-focus mechanism has a focal position detecting device for measuring focal positions on the surface of the wafer corresponding to the predetermined measuring points in the exposure field of the projection optical system.

In order to measure the inclination of the best image forming plane with respect to the stage running plane, the XY stage is operated so as to move measuring points on the surface of the wafer to a first projection point in the exposure field of the optical system, and a mark image for measuring the focal position of a reticle is projected on the projection point, after the leveling stage has been locked in a predetermined inclined state and the focal positions of the measuring points on the surface of the wafer have been set at a first focal position by means of the focal position detecting device. Focus measuring mask images are projected by gradually changing the focal position of the first position point, and the best focal position for the first projection point is obtained by measuring the size of the mark images after development.

Similarly, the focal positions of other projection points in the exposure field of the projection optical system are changed and their best focal positions are obtained by exposing focus measuring mark images. The flatness of the wafer surface is corrected by continuously joining the obtained focal positions whereby the inclination of the leveling plan with respect to the stage running plane is obtained.

If, in the conventional method, the wafer surface in the detecting area of the leveling sensor is irregular, the signals detected by the leveling sensor change according to the irregularity and measuring errors occur, when a plurality of the measuring points on the wafer are moved to the measuring point of the focal position detecting device by moving the XY stage and then the flatness of the wafer is measured in order to measure the inclination of the leveling plane with respect to the stage running plane. Thus, so-called super-flat wafers which have extremely good flatness are required for performing the conventional method.

When such super-flat wafers cannot be obtained, it is necessary to find portions of normal wafers which exhibits good flatness. However, such measurement requires a long time. Even if wafers are substantially super-flat, their surface still has very small depressions and projections which exhibit irregularity. Such irregularity on the wafer surface produces a measurement error, causing difficulty in measurement at a high accuracy.

The inclination of the leveling plane with respect to the stage running plane is found indirectly in steps by obtaining the amount of inclination of the best image forming plane with respect to the stage running plane and the amount of the inclination of leveling plane with respect to the stage running plane. Thus, the measuring process is complicated and it takes a long time to perform measurement.

SUMMARY OF THE INVENTION

An object of the present invention is to provide a leveling plane method for measuring inclination of a leveling plane with respect to the best image forming plane rapidly at a high efficiency without using special super-flat wafers.

The present invention provides a leveling plane measuring method for obtaining inclination of a leveling plane of a projection exposure apparatus with respect to the best image forming plane of a projection optical system, the projection exposure apparatus comprising the projection optical system for projecting, on a photosensitive substrate, transcribing pattern images formed on a mask and leveling means for holding an exposure face of the photosensitive substrate in parallel with the leveling plane, the method comprising;

a first step of coinciding, with a first focal position, focal positions which are positions of measuring points on an exposure face of the photosensitive substrate along an optical axis of the projection optical system and which correspond to predetermined focus measuring points in the exposure field of the projection optical system, by using, as the above-mentioned mask, a mask formed with focus measuring marks at conjugate positions with a plurality of image plane measuring points in an exposure field of the projection optical system; and a second step of moving the leveling means so that the average plane of the exposure face of the photosensitive substrate is made in parallel with the leveling plane and exposing images of the marks on the photosensitive substrate.

Further, the present Invention includes a third step for displacing the photosensitive substrate in a plane perpendicular to the optical axis of the projection optical system, setting the focal position on the exposure face of the photosensitive substrate at a position different from the first focal position and positions which have already been set and repeating the second step predetermined times, and a fourth step of finding the best focal positions for the image plane measuring points in the exposure field of the projection optical system so that the inclination of the leveling plane is found from the best focal positions of the image plane measuring points.

In this case, it is preferred that the photosensitive substrate be displaced in a direction perpendicular to the optical axis of the projection optical system and the images of the focus measuring marks be exposed on the exposure face of the photosensitive substrate without changing the focal position of the exposure face in the second step, and the best focal positions for the image plane measuring points in the exposure field of the projection optical system be obtained from the average of the sizes of the images of the focus measuring marks found corresponding to the set focal positions in the fourth step.

According to the present invention, the images of the focal position measuring marks are exposed on the exposure field of the projection optical system by changing the focal position of the photosensitive substrate while the leveling means is moved. The sizes of the images of the focus measuring marks at the image plane measuring points are obtained, whereby the best focal positions at the image plane measuring points are found. Since the leveling means is in an on state in this condition, the amount of the inclination of the best image forming plane is obtained directly and rapidly by joining the obtained best focal positions.

However, the images of the exposed focus measuring marks are influenced by the flatness of a local portion or portions of the photosensitive substrate. So long as the surface of the photosensitive substrate is not very flat, the focal positions at the time of exposure of the images of the focal measuring marks are different from the set focal positions except for the measuring point of the focal position detected by the focal position detecting device. In this connection, the images of the focus measuring marks are exposed on the exposure face of the photosensitive substrate in the second step without changing the focal position of the exposure face, and the average of the sizes of the images of the focus measuring marks corresponding to the set focal positions is calculated in the fourth step, whereby the adverse effect on the flatness of the local portion or portions of the photosensitive substrate at the time of the exposure can be reduced and the inclination of the best focal forming plane can be calculated more accurately.

DETAILED DESCRIPTION OF THE PREFERRED EMBODIMENTS

A leveling plane measuring method will be described with reference to the accompanying drawings. In this embodiment, a projection exposure apparatus provided with an auto-leveling mechanism and an auto-focussing mechanism is used to make a leveling plane to coincide with the best image forming plane of the projection optical system.

Figure 2:
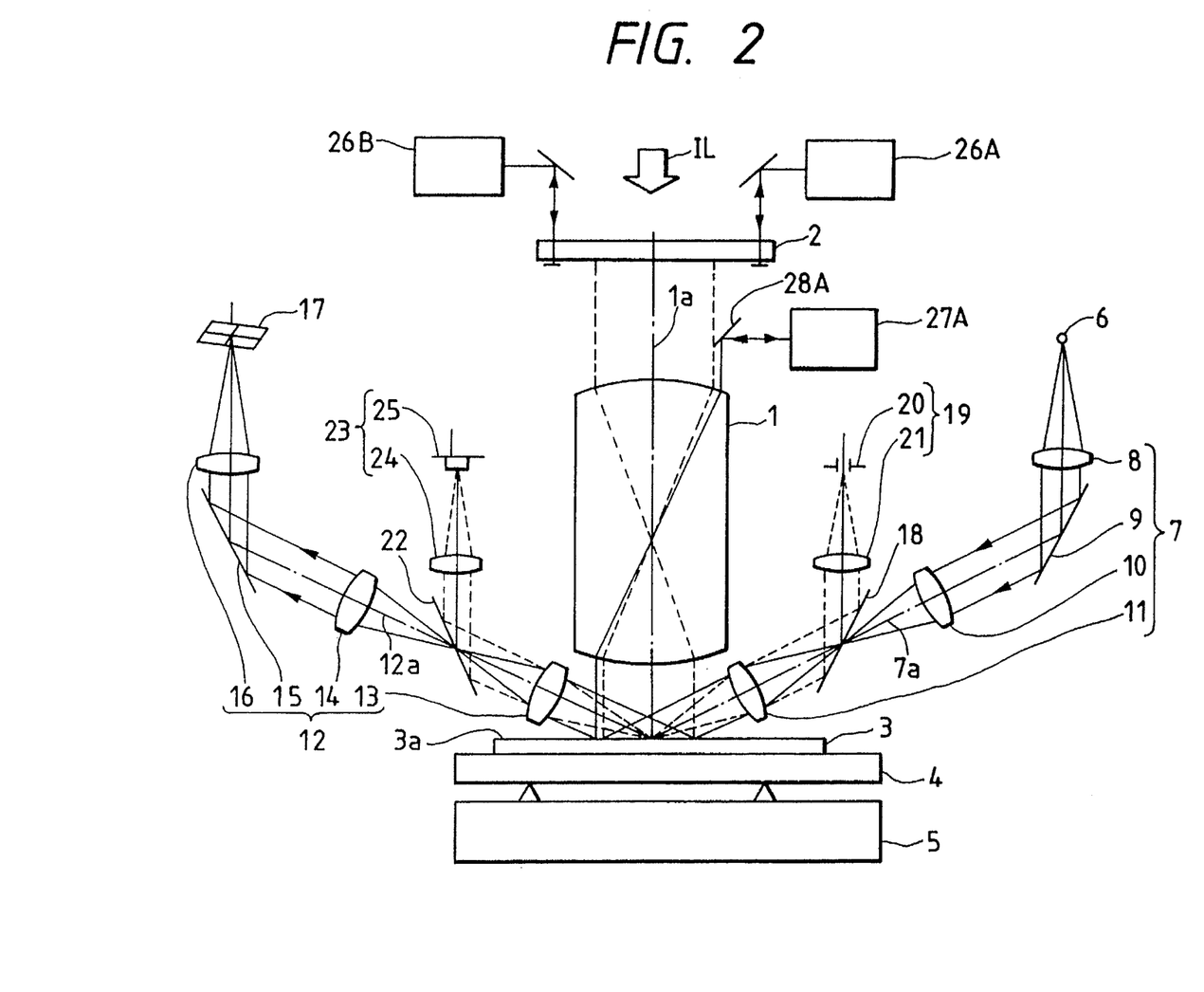
FIG. 2 is a structural view showing the main portion of a projection exposure apparatus to which the measuring method of FIG. 1 is applied.

FIG. 2 shows the main portion of the projection exposure apparatus used for this method embodiment. A reticle 2 formed with a transcribing pattern is illuminated with exposure light IL emitted from an illuminating optical system (not shown) in such a way that the image of a pattern formed on the reticle 2 is reduced and projected through a projection optical system 1 on a wafer 3 coated with photosensitive material. The wafer 3 is held on a leveling stage 4 which is mounted on a wafer stage 5. The wafer stage 5 comprises an XY stage for positioning the wafer 3 in a plane (XY plane) perpendicular to the optical axis 1a of a projection optical system 1 and a Z stage for positioning the wafer 3 in a position along the Z axis parallel with the optical axis 1a of the projection optical system 1. The inclination angle of the leveling stage 4 can be changed by lifting and lowering two points out of three supporting points of the Z stage.

As disclosed in U.S. Pat. No. 4,558,949, a leveling sensor for the leveling mechanism performing the method of this embodiment comprises a light source 6, an illuminating optical system 7 for making light beams from the light source 6 parallel and emitting the same on the surface 3a (the exposure face) of the wafer 3, a converging optical system 12 for converging the reflected light beams from the surface 3a of the wafer 3, and a light receiving element 17 for detecting the intensity distribution of the converged light beams. The light receiving element 17 is divided into four light receiving faces from which independent photoelectrically converted signals are outputted. The light receiving element can be replaced by a two-dimensional CCD.

In this state, both the inclined optical axis 7a of the illuminating optical system 7 and the inclined optical axis 12a of the collimating optical system 12 are arranged substantially symmetrical with respect to the optical axis 1a of the projection optical system 1. In the illuminating optical system 7, light beams from the light source 6 are made substantially parallel with each other by means of a collimator lens 8, reflected by a mirror 9 and converged by a converging lens 10 to be focussed on a half mirror 18. The light beams passing through the mirror 18 diverge. Thereafter they are made parallel by means of an illumination objective lens 11 and are incident on the surface 3a of the wafer 3. The area of the surface 3a of the wafer 3 substantially covers an area conjugate with the pattern forming area of the reticle 2 with respect to the projection optical system 1.

In a converging optical system 12, the light beams reflected by the surface 3a of the substrate 3 are converged by a converging objective lens 13 and also converged on the light receiving face of the light receiving element 17 through a collimator lens 14, a mirror 15 and a converging lens 16. Thus, the light beams from light source 6 are focussed again on the light receiving face of the light receiving element 17. The light receiving face of the light receiving element 17 is perpendicular to the optical axis 12a of the converging optical system 12 and obtains two inclination signals corresponding to the center of gravity of the light distribution on the light receiving face on the basis of the four photoelectrical signals outputted from each of the four light receiving portions of the light receiving element 17.

As the inclination of the surface of the wafer 3 changes, the center of gravity of the light distribution also deviates. Thus, the inclination of the surface 3a of the wafer 3 can be obtained from the two inclination signals. Since the amounts of the changes in the two inclination signals have been previously obtained in accordance with the amount of the change in the inclination of the surface 3a of the wafer 3, the surface 3a of the wafer 3 is maintained parallel with a predetermined leveling plane by setting the inclination of the leveling stage 4 to the predetermined value so that the two inclination signals retain the predetermined levels, i.e., by setting the leveling mechanism in an on state, whereby auto-leveling is performed.

In this embodiment, the focal position detecting device of the auto-focussing mechanism and the leveling sensor commonly use some of the optical systems. A beam splitter 18 is disposed between the converging lens 10 and the illuminating objective lens 11 in the illuminating optical system 7, and a light sending system 19 of the focal position detecting device is provided over the beam splitter 18. Light loss can be reduced by using a dichroic mirror in place of the beam splitter 18 when the light wavelength ranges in the focus detecting device and the leveling sensor differ from each other. In this case, a dichroic mirror is used as the beam splitter 22.

Figure 1:
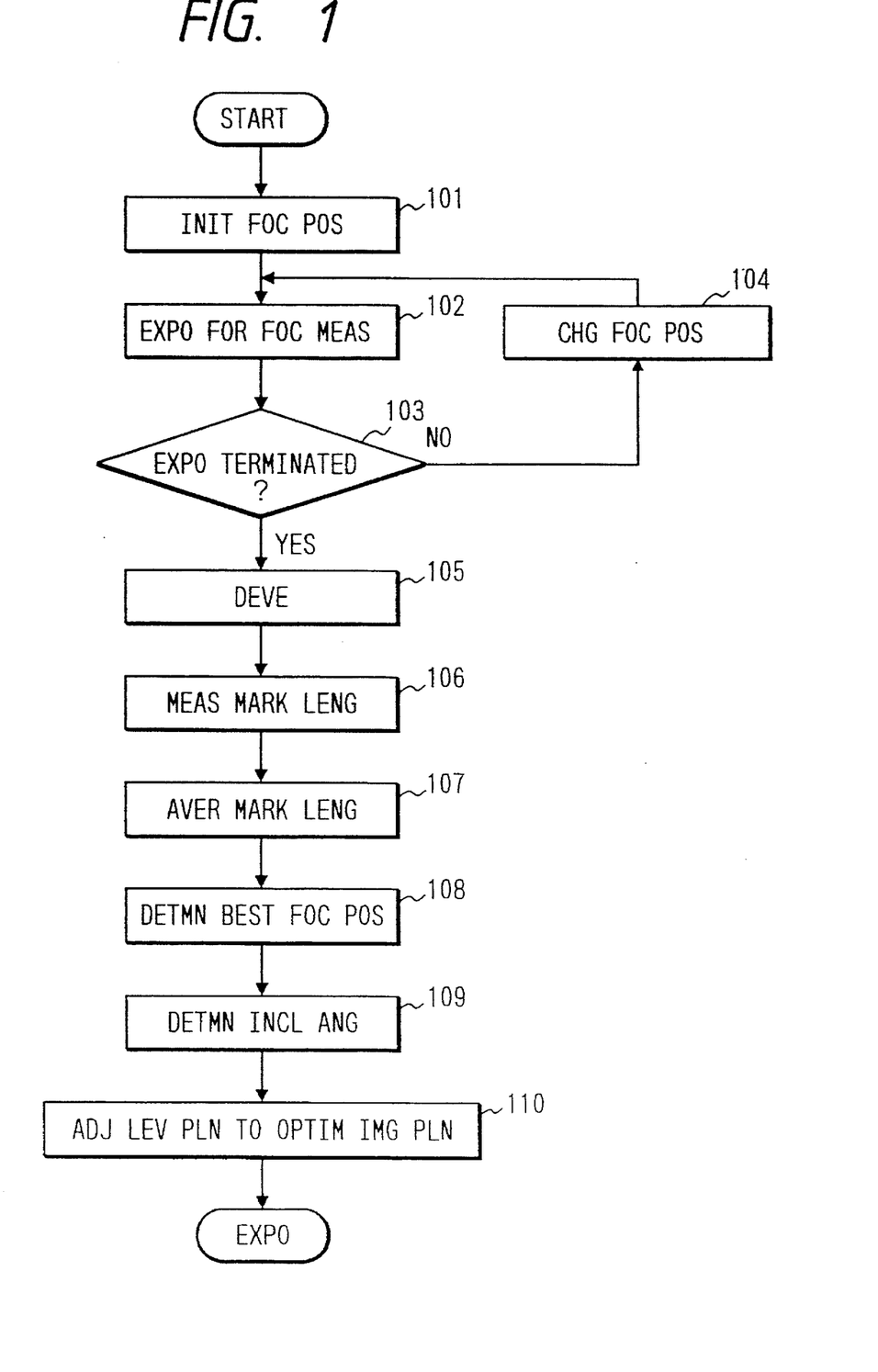
FIG. 1 is a flow chart showing the operation of one embodiment of a leveling plane measuring method according to the present invention.

In the light sending system 19, a slit plate 20 formed with a slit pattern extending in the direction perpendicular to the paper sheet of FIG. 1 is illuminated with the light beams emitted from the light source (not shown), and the light beams which have passed through the slit pattern travel to the beam splitter 18. The light beams reflected by the beam splitter 18 are collected on a measuring point on the surface 3a of the wafer 3 and in the vicinity of the optical axis 1a of the projection optical system 1, and the image of the slit pattern of the slit plate 20 is focussed on the measuring point.

Similarly, a beam splitter 22 is provided between the converging objective lens 13 and the collimator lens 14 of the converging optical system 12, and the reflected light beams from the image of the slit pattern on the surface 3a of the wafer 3 are supplied to a light receiving system 23 through the converging objective lens 13 and the beam splitter 22. In the light receiving system 23, the light beams reflected by the beam splitter 22 are converged onto the light receiving face of a photoelectric element 25 by a converging lens 24, and the slit pattern image of the slit plate 20 is focussed again on the receiving face. The photoelectric element 25 has a single light receiving face. Although not shown in the drawings, the photoelectrical element 25 is provided in the vicinity thereof with an oscillating slit plate which is formed with a slit pattern extending in the direction perpendicular to the paper sheet of FIG. 1. In order to obtain focus signals, the oscillating slit plate is oscillated in the directions of the width of the slit pattern at a predetermined period, and the output signal of the photoelectric element 25 is synchronously rectified by a driving signal of the oscillating slit plate.

As the surface 3a of the wafer 3 moves along the optical axis 1a of the projection optical system 1, the pattern image of the slit focussed again on the light receiving face of the photoelectrical element 25 is moved in the direction of the width of the slit, whereby the position of the surface 3a of the wafer 3 along the optical axis 1a of the projection optical system 1, i.e., the focal position of the surface 3a can be detected. The focus signals obtained by synchronously rectifying the output signals of the photoelectrical element 25 are substantially linearly changed in accordance with the focal positions in a predetermined range. When the relationship between the amount of change of the focal position and the amount of Z-direction displacement of the surface 3a of the wafer 3 has been found previously, the focal position of the measuring point of the surface 3a of the wafer 3 can be detected from the focus signal.

Three alignment microscopes 26A to 26C are arranged over the reticle 2 (the alignment microscope 26C being not shown in FIG. 2) so that they detect the positions of three alignment marks provided outside of the pattern area on the reticle 2. The reticle 2 is aligned by arranging the three alignment marks at predetermined positions.

As disclosed in U.S. Pat. No. 4,677,301, an X-axis alignment system 27A of a laser step alignment type (hereinafter referred to as the "LSA" type) is provided at a side of the projection optical system 1. Laser beams emitted from the X-direction alignment system 27A are reflected by a mirror 28A and enter the projection optical system 1. The laser beams emitted from the projection optical system 1 are collected on the surface 3a of the wafer 3 as a slit-like spot extending perpendicularly to the paper sheet of FIG. 2 (the perpendicular direction being hereinafter referred to as the "Y-direction"). The spot light reflected in a predetermined direction passes through the projection optical system 1 and is reflected by the mirror 28A. Thereafter it is detected by the light receiving portion of the X-direction alignment system

27A.

Provided at one side of the projection optical system 1 is a Y-axis alignment system of LSA type (not shown) from which laser beams as slit-shaped spot light extending in the X direction (in parallel with the paper sheet of FIG. 2) are emitted onto the wafer 3 through the projection optical system 1. As will be described later, the size of the image of the focus measuring mark formed on the surface 3a of the wafer 3 is measured by using the X-axis alignment system 27A of LSA type and the Y-axis alignment system of LSA type.

An embodiment of the method of aligning the surface 3a of the wafer 3 with the best image forming plane of the projection optical system 1 by using the projection exposure apparatus as shown in FIG. 2 will be described according to a flow chart shown in FIG. 1.

Figure 3A:
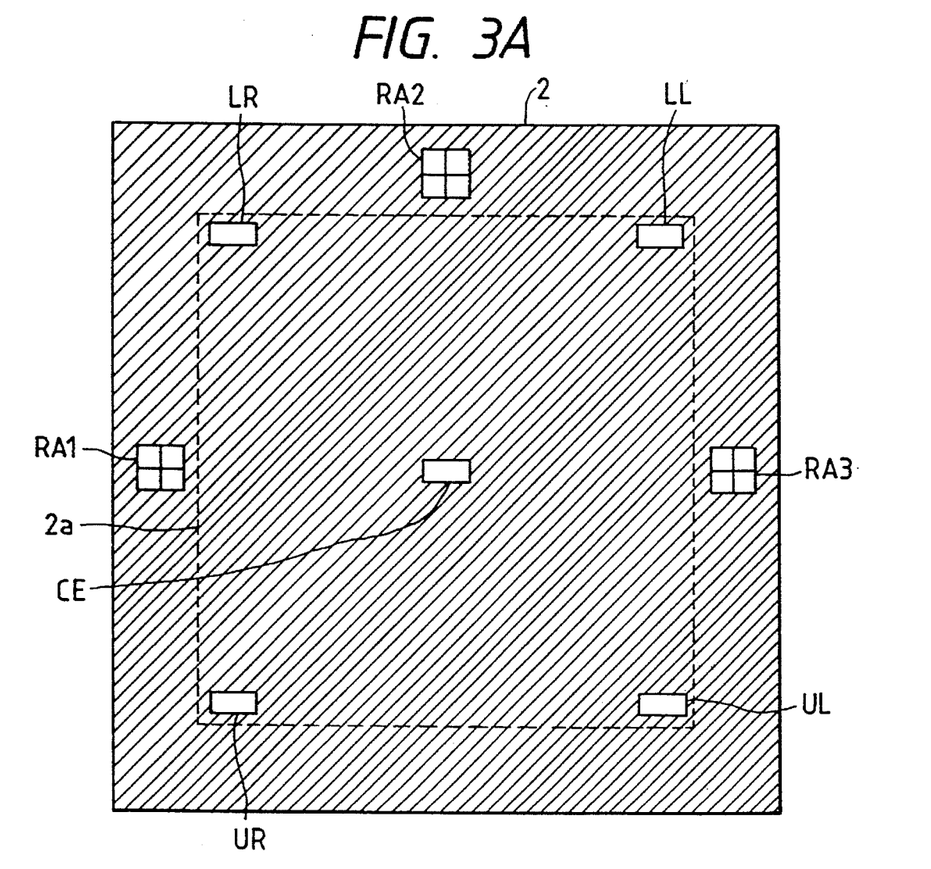
FIG. 3A is a plan view showing the pattern of a reticle used for practicing the embodied method of the present invention.
Figure 3B:
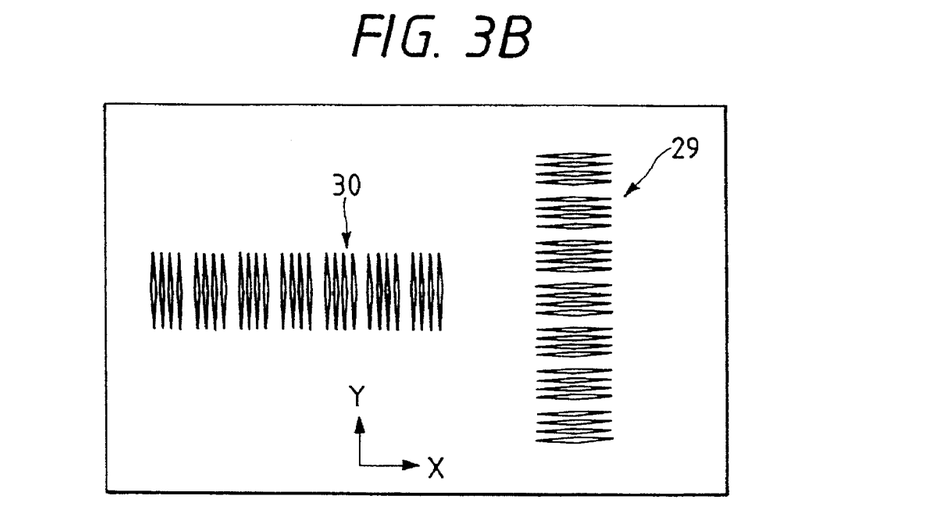
FIG. 3B is an enlarged plan view of a focus measuring mark in the reticle pattern in FIG. 3A.

FIG. 3A shows a pattern of the reticle 2. Focus measuring marks CE, UL, UR, LL and LR are formed on the center and four corners of the pattern area 2a of the reticle 2, respectively. As shown in FIG. 3B, each focus measuring mark includes a first mark portion 29 comprising first pattern groups arranged side by side in the Y direction at predetermined intervals and a second mark portion 30 comprising second mark pattern groups arranged side by side in the X direction at predetermined intervals. Each first mark pattern group comprises four first rhombic mark patterns extending in the X direction and arranged side by side in the Y direction, and each second mark pattern group comprises four second rhombic mark patterns extending in the Y direction and arranged side by side in the X direction.

When the image of the Y-direction focus measuring mark portion 29 projected on the exposure face of the wafer is at the best focal position, the projected image has the longest length in the X direction. Exposure of the image of the Y-direction focus mark 29 on the wafer 3 is repeated a plurality of times by changing focal positions and the sizes of the images are measured, thereby to calculate the best focal position for the Y-direction focus measuring mark 29. Similarly, exposure of the image of the X-direction focus measuring mark 30 on the wafer 3 is repeated a plurality of times by changing focal points and the sizes of the images are measured, thereby to calculate the best focal position for the X-direction focus measuring mark 30.

At Step 101 in FIG. 1, a wafer 3 as a photosensitive substrate is mounted on the leveling stage 4 in FIG. 2 by a wafer holder (not shown), and the focal position of the surface 3a of the wafer 3 on the measuring point of the focal position point detecting device is set at the initial level. For example, the lower limit or the upper limit of the movable range of the surface 3a of the wafer 3 at the current exposure with the previous focal position taken as the center of the range is selected as the initial position. Then, at Step 102, the leveling mechanism is moved to align, with a previously set leveling plane, the average plane of the leveling detecting area conjugate substantially with the pattern area of the reticle 2 on the surface 3a of the wafer 3 in FIG. 2, and the images of the five focal position point measuring marks in the pattern area 2a of the reticle 2 as shown in FIG. 3A are exposed on the first shot area of the wafer 3 in a state in which the shots partially overlap with each other.

Figure 5:
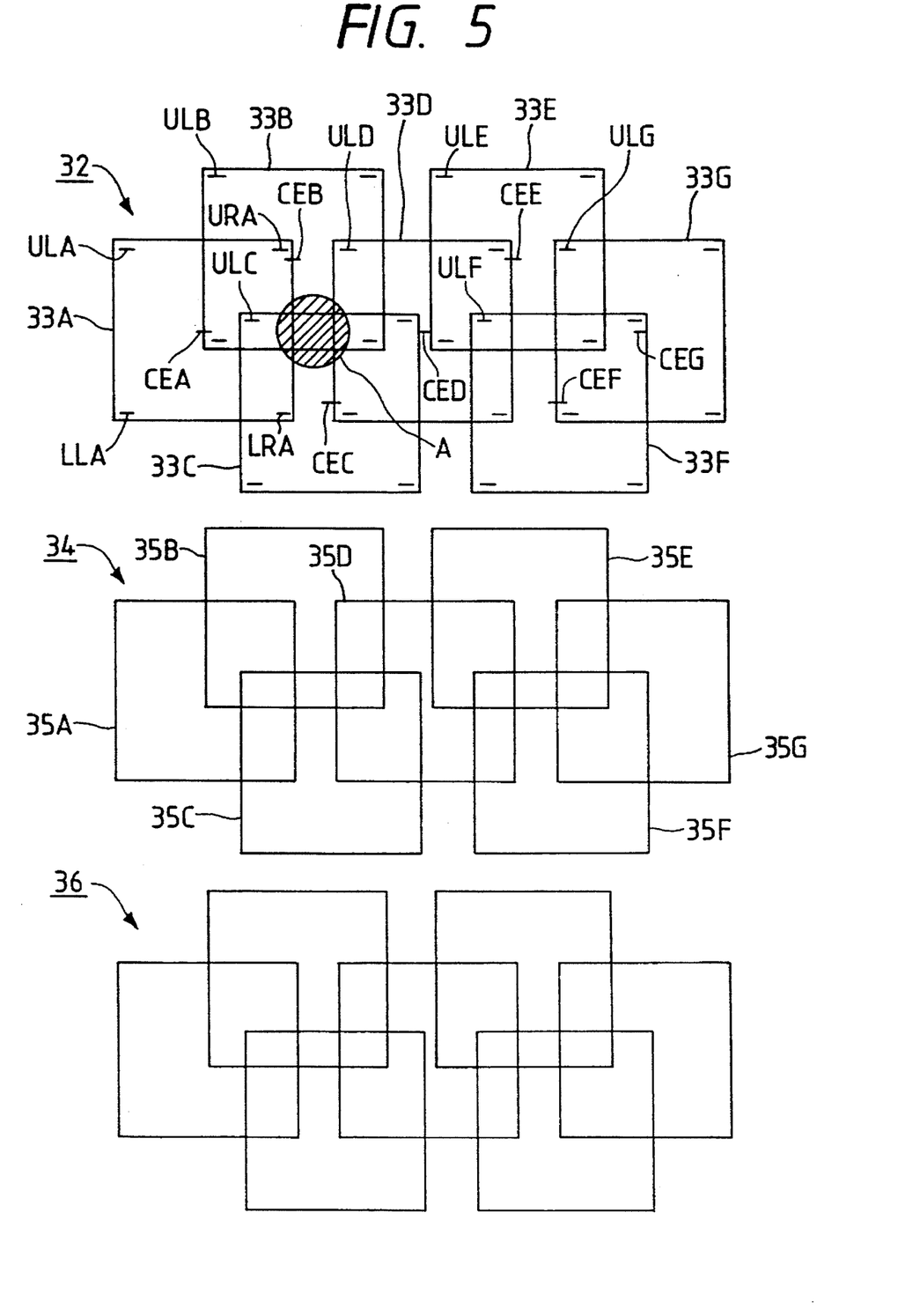
FIG. 5 is a plan view of parts of the arrangements of shot areas exposed on a wafer in the embodiment.

In this case, the images of the five focal position measuring marks of the reticle 2 are exposed on the seven shot areas overlapping with one another by stepwise moving the XY stage in the wafer stage 5 in FIG. 2 in the XY plane and exposing the pattern of the reticle 2. As shown in FIG. 5, the first to seventh shot areas 33A to 33G are exposed in a state in which they partially overlap with one another in the first exposure area 32 of the wafer 3. The images of the five focus measuring marks CE, UL, UR, LL and LR as shown in FIG. 3A are exposed on the first shot area 33A, and similarly, images of the five focus measuring marks are exposed on each of the other shot areas 33B to 33G.

The focuses of the images CEA to CEG of the focus measuring marks exposed on the centers of the seven shot areas 33A to 33G are commonly set at the first focal position point.

Thereafter the process goes from Step 103 to Step 104 change the focal position of the measuring point of the surface 3a of the wafer 3 by a predetermined stepping amount. When the initial value of the focal position of the surface 3a of the wafer 3 is the value at the lower limit of the movable range, the focal position is gradually raised. On the other hand, when the initial value is the value at the upper limit of the movable range, the focal position is gradually lowered. Then, Step 102 is executed to expose the images of the five focus measuring marks of the reticle 2 as shown in FIG. 3A in the seven shot areas partially overlapping with one another, in the unexposed second exposure area on the surface of the wafer 3 as a photosensitive substrate.

In this way, as shown in FIG. 5, the first to seventh shot areas 35A to 35G partially overlap with each other on the second exposed area 34 on the wafer 3, whereby the images of the five focus measuring marks are exposed on each of the shot areas 35A to 35G. In this case, the focuses of the images of the focus measuring marks exposed on the centers of the seven shot areas 35A to 35G are commonly set at the second focal position.

Steps 104 and 102 are repeated until the focal positions arrive at the upper limit or the lower limit while the leveling mechanism is in an on state. In this way, the images of the focus measuring marks of the reticle 2 are exposed at the same focal position seven times on each of the third, fourth, - - - n-th exposure areas 36, - - - . When each focal position arrives at the lower or upper limit, the process goes from Step 103 to Step 105 to develop the wafer 3.

At Step 106, the lengths of the images of a large number of the focus measuring marks on the developed wafer 3 (mark lengths) are measured.

Figure 4A:
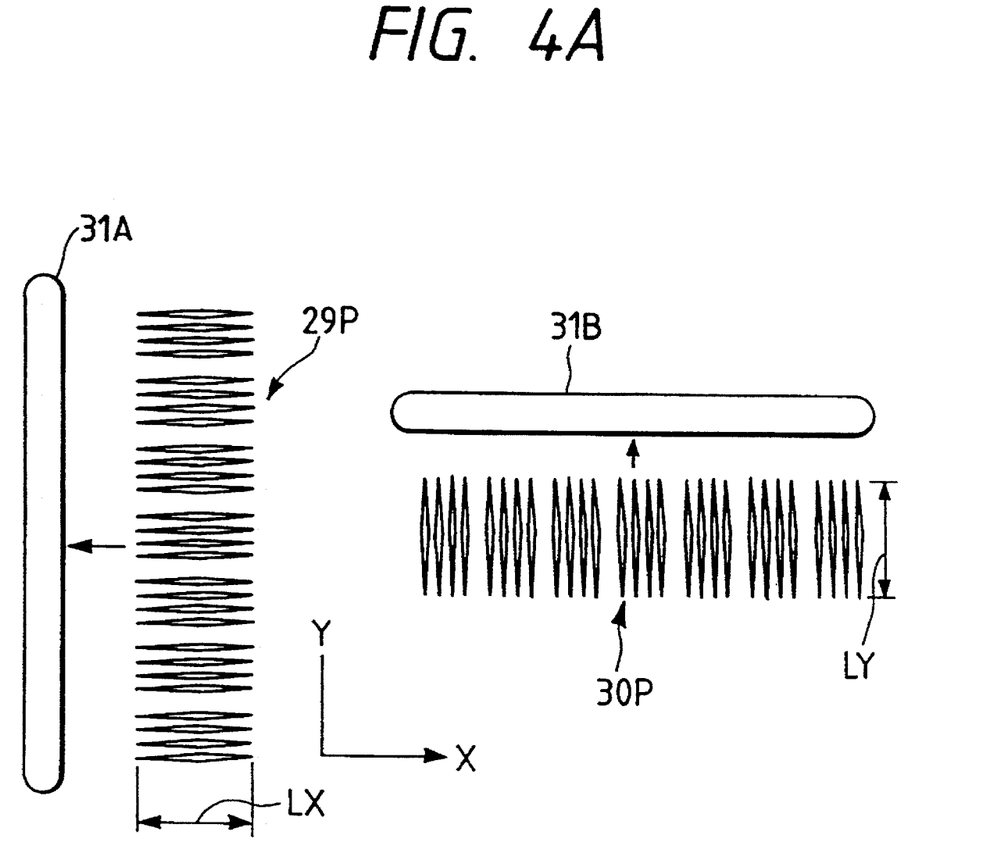
FIG. 4A is an enlarged plan view showing the images of focus measuring marks projected on a wafer in the embodiment.

FIG. 4A shows image portions 29P and 30P of the focus measuring marks of the object to be measured. As shown in FIG. 4A, the laser beams emitted from the X-axis alignment system 27A of LSA type in FIG. 2 as slit-shaped scanning beams 31A extending in the Y direction are lit on a portion close to the image portion 29P of the Y-direction focus measuring mark on the wafer 3. While the image portion 29P of the focus measuring mark is illuminated with the slit-shaped scanning beams 31A, diffracted light beams are emitted from the mark image portion 29P in a predetermined direction by moving the wafer stage 5 of FIG. 2 in the X direction in this condition. The diffracted light beams are detected by the alignment system 27A in FIG. 2, and the magnitudes of the obtained detected signals S are plotted on X-S coordinates. The curve in FIG. 4B shows that the values of S are large in the range in which the mark image 29P exists.

Figure 4B:
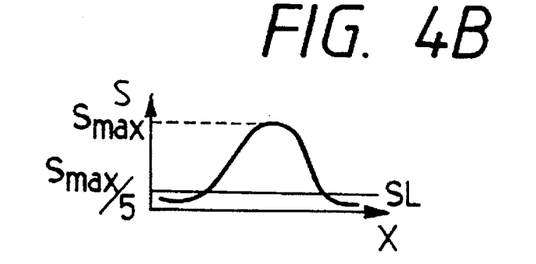
FIG. 4B is a diagram showing a wave shape of an example of the detection signal obtained from the image of a focus measuring mark.

Thus, it is possible to obtain the mark length LX of the mark image 29P for a focus measurement, by wave-shapingly processing the detected signals S in FIG. 4B with a predetermined threshold value (a slice level).

Specifically, in order to obtain the mark length LX, a peak value (the maximum intensity) Smax of the detected signals S from the mark image 29P (FIG. 4B) is obtained, and the slice level SL is determined on the basis of the peak value Smax. For example, the slice level SL is set as 20% of the datum intensity Smax, that is, as an intensity Smax/5. As shown in FIG. 4B, each coordinate value in the X direction which is a cross point between the detected signals S and the slice level SL, is obtained to determine a distance between the coordinate values as the mark length LX for the focus measurement. However, the intensity of the slice level is not limited to 20% of the datum intensity. Similarly, as shown In FIG. 4A, the laser beams emitted from the Y-direction alignment system of LSA type (not shown in FIG. 2) are incident, as slit-shaped scanning beams 31B extending in the X direction, on a portion in the vicinity of the image portion 30P of the X-direction focus measuring mark on the wafer through the projection optical system 1 as shown in FIG. 4A. The wafer stage 5 in FIG. 2 is moved in the Y direction and the diffracted light beams are detected, whereby the Y-direction mark length LY of the image portion 30P of the X-direction focus measuring mark is measured. A more concrete measuring method of the mark length is disclosed in Japanese Laid-Open Patent Application No. 1-187817.

Next at Step 107, with respect to each of five marks CE, UL, UR, LL and LR for the focus measurement in FIG. 3A, a plurality of mark lengths of the mark images corresponding thereto are averaged in process. Referring to the first exposing area 32 in FIG. 5, with respect to the mark UL for the focus measurement, each mark length of the mark images ULA to ULG formed at the left upper corner of the seven shot areas 33A to 33G is averaged. Similarly, with respect to the residual four marks, average values of the seven mark lengths are respectively obtained. In this embodiment, the obtained average values are regarded as positions conjugated with the marks for the focus measurement with respect to the projection optical system 1, that is, the mark lengths at measuring portions set in the exposure field of the projection optical system 1. Moreover at Step 107, with respect to the second exposing area 34 and the third exposing area 36, similarly to the first exposing area 32, the seven mark lengths of the mark images in relation to each of the five marks of the focus measurement are averaged. That is, at Step 107, with respect to each of a plurality of the focus positions set at Steps 101 and 104, a mark length (an average value) corresponding to each of the five marks for the focus measurement is obtained.

Since each of the focus measuring mark images ULA to ULG comprises an X-direction mark image part and a Y-direction mark part, averaging in both mark image parts is performed separately. Similarly, the mark length at the measuring point conjugate with the other focus measuring marks UR, LL, LR and CE is represented by the average of the corresponding seven mark lengths. In order to explain the advantageous effect of the averaging, it is assumed that the central area A defined between the four shot areas 33A to 33D is raised.

In this case, the right side end portion of the first shot area 33A, the left side end portion of the fourth shot area 33D, the lower side end portion of the second shot area 33B and the upper side portion of the third shot area 33C are raised. The shot areas 33A to 33D are inclined due to the existence of the convex or raised area A, but the remaining three shot areas 33E, 33F and 33G are not influenced by the raised area A. The focal portions (first focal positions) of the central focus measuring mark images CEA to CED are the same even in the shot areas 33A to 33D that incline by the raised area A, and the shot areas 33A and 33B are inclined reversely from the shot areas 33D and 33C, respectively. For example, the focus measuring mark image ULA in the first shot area is assumed to be low. Then, the focus measuring mark image ULA in the fourth shot area 33D is high. Thus, the average of the seven focus measuring mark images ULA to ULG is substantially the same as the first focal position.

This means that the average of the focus measuring mark images ULA to ULG can be considered to be the accurate mark length at the first focal position. In other words, the averaging of the mark lengths of the seven focus mark images for each of the exposure areas 32, 34, 36, - - - in FIG. 5 minimizes adverse effect of deviation of flatness in local portions of the wafer on the determination of the mark length. The focal positions for the images of the seven central focus measuring marks CE of each of the exposure areas 32, 34, 36, - - - are the same and the advantageous effect of the averaging is that average the measuring errors are averaged. Since the inclination of the image can be obtained only from the focal positions of the four corners of the exposure field, it is unnecessary to measure the focal position of the measuring point which is conjugate with the central focus measuring mark CE, if mere inclination of the image is to be measured.

Thereafter, at Step 108, the X and Y direction best focal positions of the measured points conjugate with the five focus measuring marks CE. UL, UR, LL and LR in FIG. 3A from the averaged mark length are obtained. The best focal position is defined by the focal position at which the measured mark length is the longest.

In this embodiment, under a statistical calculation, for example a least square, the previously measured mark length is approximated with a (e.g. biquadratic) function in which a focus position is variable. A focus position in which the mark length is maximum, is obtained under the approximate function obtained from the least square. Incidentally, a focus position corresponding to the maximum mark length within the previously measured lengths may be determined as a best focus position.

Thereafter, at Step 109, the inclination of the best image forming plane obtained by joining the best focal positions found at Step 108 is obtained. The inclination is divided into inclination with respect to the X axis and inclination with respect to the Y axis. The best image forming plane is also divided into an X direction plane and a Y direction plane, the difference of which corresponds to astigmatism. In this case, these two average planes are used as the two best image forming planes. The best image forming planes formed in this way are obtained while the leveling mechanism is in motion. The thus obtained inclination of the best image forming plane shows the Inclination (the Inclination difference) of the actual best image forming plane of the projection optical system 1 with the leveling plane.

At Step 110, the inclination obtained at Step 109 is corrected with respect to the leveling plane, and the leveling mechanism is operated so that the surface 3a of the wafer 3 as shown in FIG. 2 is set in parallel with the best image forming plane of the projection optical system 1. Thereafter, the reticle 2 is replaced by an exposure reticle, and exposure is performed on a new wafer by moving the auto-leveling mechanism and auto-focusing mechanism. Thus, even if the surface 3a of the wafer 3 has local projections and depressions in this embodiment, the leveling plane can be set in parallel with the best image forming plane rapidly at a high accuracy by changing the focal position, exposing the pattern of the reticle 2 and measuring the mark lengths of the exposed focus measuring images.

Figure 6A:
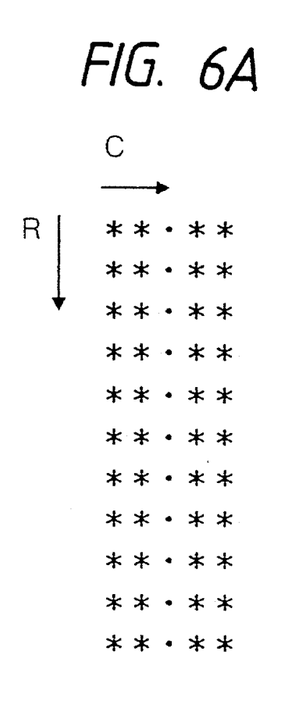
FIG. 6A shows an example of a shot map.
Figure 6B:
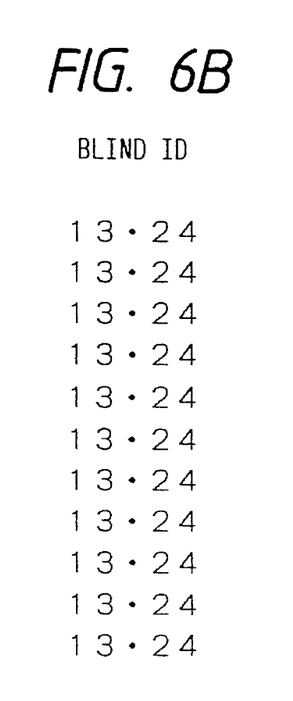
FIG. 6B shows an example of a blind ID corresponding to the shot map of FIG. 6A.
Figure 6C:
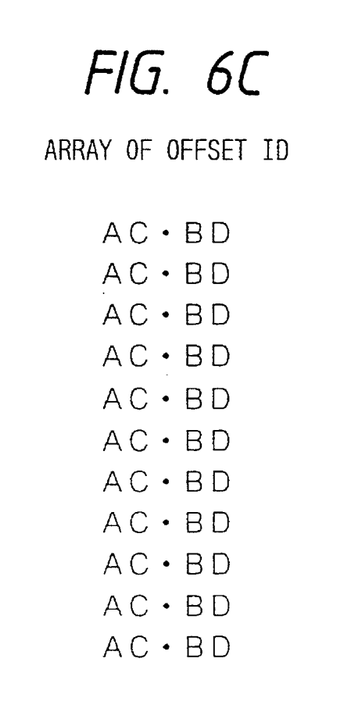
FIG. 6C shows an example of an offset ID corresponding to the blind ID of FIG. 6B.

Referring to FIGS. 6A to 6C, another embodiment of the method how to measure the mark length of the focus measuring mark images at Step 106 in FIG. 1 will be described.

In this embodiment, position Information of mark images of the object to be measured such as the focus measuring mark images ULA, LRA, etc. in FIG. 5 is divided into information of the shot areas (measuring shot areas) of the object to be measured and information of the-mark images of the object to be measured in the corresponding measurement shot areas. In such arrangement, it is convenient that the ordinary exposure shot Information can be used as information of the measuring shot areas. The information of the mark image of the object to be measured in the measuring shot of each of the shot areas 33A, 33B, - - - in FIG. 5 can include the information on measurement algorithm, the position and the shape of the corresponding mark image.

In this embodiment, the information on the measurement shot area includes the following four pieces of information:

(1) the arrangement of shot areas;

(2) the positions of shot areas in which alignment marks for positioning the measuring wafer and the positions of the mark images of the objects to be measured in the shot areas exist;

(3) whether or not the corresponding shot areas are measured;

(4) the order of measurement of the shot areas.

Information on the mark images of the objects to be measured in the shot areas includes the following three pieces of information:

(1) information on the shape of each mark image;

(2) information on the measuring sensor and the measurement algorithm; and (3) information on the position of each mark image.

The position information of each mark image includes a plurality of points In each measuring shot area whose positions are measured with respect to the X and Y directions. In each measuring shot area, the measured results of the mark lengths of the mark images in each measuring direction are averaged, and the average is defined as the measured result of the mark length of the measuring point in the corresponding measuring direction in the corresponding exposure field of the projection optical system 1. Further, the average is defined as a value expressing the focal position of the measuring position of the measuring shot area.

The arrangement of the shot areas of the objects to be measured and their positions in the exposure field are correlated to each other in the following three ways.

(1) In, for example, a shot map as shown in FIG. 6A wherein the measuring shot area is continuous in the row direction (R direction) at the same position in the columns (the direction of the column being Indicated by the C direction), it is assumed that the mark image of the same measuring point is exposed on a group of the shot areas of the corresponding row.

(2) It is assumed that the focal positions change in the row direction in the shot areas on which the mark image of the same measuring point in the exposure field is assumed to be exposed.

(3) In order to measure a group of shot areas continuously, the measurement of the shot areas is controlled by parameters determining the measurement order of the measuring shot areas such as identification numbers (ID numbers) for setting blinds (field stops) at the time of exposure. When the number of the measuring points in the exposure fields of the objects to be measured is more than the number of the parameters for setting the blinds, non-measuring shot areas are provided between the measuring shot areas provided with the ID numbers for setting the same blinds, or the positions of the shot areas are changed in the column direction (C direction).

As the mark images of the objects to be measured designated in the corresponding shot areas are located at the corresponding positions in the shot areas at the time of exposure, the positions of the mark images of the objects to be measured differ from each other depending upon the arrangement of the measuring marks on the reticle which have been used for the exposure. It is, therefore, necessary to give the shot areas to be measured identification numbers (hereinafter referred to as the "off-set IDs") showing different measuring positions per group of the shot areas.

In the shot map as shown in FIG. 6A, the exposure shots shown by asterisks are defined as measuring shot areas, and the exposure shots shown by dots are defined as non-measuring shot areas. The measurement is carried out in the order of 1, 2, 3 and 4 according to the ID numbers for setting the blinds (hereinafter referred to as the "blind ID"). FIG. 6B shows a concrete shot map which designates blind IDs, in which measurement is performed in the order of the first shot area, the fourth shot area, the second shot area and the fifth shot area in the column direction (C direction) but the third shot area is not measured.

Let it be assumed that the shot areas having the values of the blind IDs 1, 2, 3 and 4 correspond to the measuring points conjugate with the focus measuring marks UL, UR, LL and LR in FIG. 3A. As shown in FIG. 6C, A, B, C and D are given as the off-set IDs to the shot areas whose blind IDs are 1, 2, 3 and 4, respectively. Let it be assumed that the shot pitch in the X direction at the measurement is Px, the coordinates of the measuring points conjugate with the focus measuring marks UL, UR, LL and LR in FIG. 3A are (−66 x, Δy), (Δx, Δy), (−Δx, −Δy) and (Δx, −Δy). Then, the amounts of the off-sets corresponding to the off-set IDs are given as follows:

the off-set coordinates of the off-set ID at A:

(2Px−Δx, Δy);

the off-set coordinates of the off-set ID at B:

(Δ−Px, Δy);

the off-set coordinates of the off-set ID at C:

(Px−Δx, −Δy); and the off-set coordinates of the off-set ID at D:

(Δx−2Px, −Δy).

It is unnecessary to measure the focal position of the measuring point conjugate with the central focus measuring mark CE if merely inclination of the image is required to be obtained. Thus, the coordinates of the focus measuring mark CE are not described.

The measurement order of the measuring shot area group, the positions of the measuring points in the exposure field and the relation between the measuring direction and the direction of the actual pattern can be inputted. In order to do so, data files in which data of the names of the measuring points and the X and Y coordinates In the shot areas of the measuring points arranged in the measuring order may be prepared. Let it be assumed that Δx=9700 μm and Δy=9700 μm. Then, the files recorded by the following information are prepared under the names of the focus measuring marks UL, UR, LL and LR.

UL

−9700

+9700

```
UR
+9700
+9700
LL
-9700
-9700
LR
+9700
-9700
```

The setting information of the focal positions at the time of exposure is inputted separately so that the positions at the shot areas and the exposure field and the focal positions are correlated with each other. Then, the measuring points in the exposure field of the projection optical system and the best focal positions with respect to the measuring direction are obtained, and the inclination of the best image forming plane can be obtained from the results.

At the focal positions, the difference between the inclination of the leveling plane at the four corners in the exposure field measured by the method of this embodiment and that measured by the conventional method was the order of 0.02 μm. Moreover, in the case of this embodiment of the present invention, it was unnecessary to select and use wafers having excellent flatness and to perform measurement in two steps, whereby rapid measurement could be performed.

At Step 102 in FIG. 1, the exposure can be performed by fixing the inclination of the leveling stage to a reset state without moving the stage. The inclination of the leveling plane can be obtained at the reset state of the leveling stage at Step 109. When the wafers to be measured can be considered as super-flat wafers, it is unnecessary to expose the focus measuring mark images on a plurality of shot areas at the same focal position.

In the present invention, it is possible to measure the condition of the image plane in the best image forming plane of the projection optical system by using a wafer whose flatness is corrected and in which the focal positions are changed at each measuring point in the exposure field at exposure.

The present invention is not limited to the aforementioned embodiments, but various modifications are applicable within the scope of the present invention.

In the present invention, the best image forming plane is obtained by exposing the focus measuring mark images while the leveling mechanism is in motion. Thus, the Inclination of the leveling plane with respect to best image forming plane can be measured rapidly at a high accuracy without using a special super-flat wafer.

When the best focal positions are obtained at a plurality of image plane measuring points in the exposure field of the projection optical system from the average of the sizes of the focus measuring mark images measured corresponding to the set focal positions, the adverse effect from the local deviation of flatness on the photosensitive substrate can be effectively removed.

What is claimed is:

1. A method of obtaining inclination of a previously set leveling plane of a projection exposure apparatus with respect to a best image forming plane, said projection exposure apparatus comprising a projection optical system for projecting, on a photosensitive substrate, images of transcribing patterns formed on a mask and a leveling system for maintaining an exposure face of said photosensitive substrate in parallel with said leveling plane, comprising:

a first step of coinciding, with a first position, a focal position which is a position of measuring points on said exposure face of said photosensitive substrate in a direction along an optical axis of said projection optical system which correspond to predetermined focus measuring points in an exposure field of said projection optical system by using said mask formed with focus measuring marks conjugate with a plurality of image plane measuring points in said exposure field of said projection optical system;

a second step of exposing images of said focus measuring marks on said photosensitive substrate in a state in which said exposure face of said photosensitive substrate is maintained in parallel with said leveling plane by operating said leveling system;

a third step of repeating said second step by shifting said photosensitive substrate in a plane perpendicular to said optical axis of said projection optical system and by moving said focal position on said exposure face of said photosensitive substrate to a different position from said first position;

a fourth step of obtaining best focal positions at said focal plane measuring points in said exposure field of said projecting optical system by measuring sizes of said images of said focus measuring marks set at said focal positions; and a fifth step of obtaining said inclination of said leveling plane with respect to said best image forming plane of said projection optical system from said best focal positions given corresponding to said image plane measuring points.

2. The method according to claim 1, wherein said second step includes shifting said photosensitive substrate In a direction perpendicular to said optical axis of said projection optical system and exposing said images of said focus measuring marks on said exposure face of said photosensitive substrate without changing said focal positions of said exposure face of the said photosensitive substrate; and said fourth step includes obtaining said best focal positions at said image plane measuring points in said exposure field of said projection optical system from an average of said sizes of said images of said focus measuring marks measured with respect to said set focal positions.

3. A method of detecting inclination of a predetermined reference plane of a projection exposure apparatus with respect to an image forming plane of a projection optical system, said projection exposure apparatus comprising a projection optical system for projecting, on a photosensitive substrate, an image of a pattern formed on a mask and a leveling system for setting a surface of said photosensitive substrate in parallel with said reference plane, comprising:

a first step of disposing a mask formed with a predetermined mark at a side of an objective plane of said projection optical system, and of driving said leveling system to make a state in which a surface of the photosensitive substrate is held in parallel with said reference plane, and exposing said mark on each of a plurality of measuring points in an image field of said projection optical system, said photosensitive substrate being moved along an optical axis direction so that the exposure is made at plural times;

a second step of detecting mark images on said photosensitive substrate corresponding to positions along the optical axis, and of determining a best focal position at each of the measuring points in the image field of said projection optical system; and a third step of calculating said inclination of said reference plane with respect to said image forming plane based on each of said best focal positions of said measuring points.

4. The method according to claim 3, wherein said mark has a wedge shape extending in a predetermined direction and is formed on a position corresponding to each of said measuring points in said image field, and said second step includes obtaining said best focal positions by measuring lengths of said images of said mark.

5. The method according to claim 4, wherein said first step includes repeating exposure a plurality of times at positions along said optical axis by moving said photosensitive substrate in a direction perpendicular to said optical axis, and said second step includes averaging said lengths of said images of said mark at said measuring points at each of said position along said optical axis.

6. A method according to claim 3, further comprising the steps of:

operating said leveling system based on the calculated inclination, so that said image forming plane of said projection optical system becomes substantially parallel to the surface of said photosensitive substrate; and exposing said photosensitive substrate with an image of the pattern on said mask.

7. A method of making an image surface of a projection optical system through which an image of a pattern on a mask is projected onto a photosensitive plate, coincident with a surface of said photosensitive plate, using a leveling system for making the surface of said photosensitive plate parallel to a predetermined reference surface, comprising the steps of:

operating said leveling system so that said surface of said photosensitive plate becomes substantially parallel to the predetermined reference surface, exposing said photosensitive plate with mark images which are respectively projected to a plurality of points in an image field of said projection optical system, and moving said photosensitive plate along a direction of an optical axis of said projection optical system to perform exposures of said plate a plurality of times;

detecting said plurality of mark images formed on said photosensitive plate, so as to obtain a best focusing position at each of a plurality of points in said image field; and calculating an inclination of said reference surface with respect to said image plane of said projection optical system based on the plurality of best focusing positions.

8. A method according to claim 7, further comprising the steps of:

operating said leveling system based on the calculated inclination, so that said image plane of said projection optical system becomes substantially parallel to the surface of said photosensitive plate; and exposing said photosensitive plate with an image of the pattern on said mask.

9. A projection exposure method comprising the steps of:

operating a leveling system so that a surface of a photosensitive plate becomes substantially parallel to a predetermined reference surface, exposing said photosensitive plate with mark images which are respectively projected to a plurality of points in an image field of said projection optical system, and moving said photosensitive plate along a direction of an optical axis of said projection optical system to perform exposures of said plate a plurality of times;

detecting said mark images formed on said photosensitive plate, so as to obtain a best focusing position at each of a plurality of points in said image field; and calculating an inclination of said reference surface with respect to an image plane of said projection optical system based on the plurality of best focusing positions.

10. A method according to claim 9, further comprising the steps of:

operating said leveling system based on the calculated inclination, so that the surface of said photosensitive plate becomes substantially parallel to said image plane of said projection optical system; and projecting images of a pattern on a mask onto said photosensitive plate through said projection optical system, so that said photosensitive plate is exposed with the pattern images.

* * * * *